(12) United States Patent
Takaoku et al.

(10) Patent No.: US 6,233,288 B1
(45) Date of Patent: *May 15, 2001

(54) SPECTRUM ANALYZER

(75) Inventors: Hiroaki Takaoku, Kumagaya; Takayoshi Fukui, Hamura, both of (JP)

(73) Assignee: Advantest Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/070,094

(22) Filed: Apr. 3, 1998

Related U.S. Application Data

(63) Continuation-in-part of application No. 08/704,622, filed as application No. PCT/JP96/00115 on Jan. 23, 1996.

(51) Int. Cl.[7] .......................... H04L 27/06; G01R 13/14; G01R 23/175; G01R 13/24
(52) U.S. Cl. .................. 375/316; 324/76.24; 324/76.27; 324/76.35
(58) Field of Search ..................................... 375/316, 377; 324/76.19, 76.21, 76.22, 76.24, 76.26, 76.27, 76.29, 77.11, 76.35; 331/4, 20, 178, 179; 455/67.1

(56) References Cited

U.S. PATENT DOCUMENTS 5,847,559 * 12/1998 Takaoku et al. .................. 324/76.27

FOREIGN PATENT DOCUMENTS

08201449 * 8/1996 (JP) .

* cited by examiner

Primary Examiner—Stephen Chin
Assistant Examiner—Albert Park
(74) Attorney, Agent, or Firm—Muramatsu & Associates

(57) ABSTRACT

A spectrum analyzer having an improved local oscillator for use in a digital step sweep is capable of minimizing a dynamic spurious response which is inverse proportional to a unit step time in the step sweep. The local oscillator includes a random clock delay which provides a random clock to a direct digital synthesizer to incorporate random timings in a time length of the unit step time for sweeping the local oscillator. In another aspect, the local oscillator includes a sweep step number control which maximizes the number of steps in the step sweep to ultimately decrease the dynamic spurious response.

11 Claims, 4 Drawing Sheets

| Sweep Time | Meas Point | Step Freq. | Div |
|---|---|---|---|
| <t1 | P1 | Span/P1 | Div1 |
| t1~t2 | P2 | Span/P2 | Div2 |
| t2~t3 | P3 | Span/P3 | Div3 |
| ⋮ | ⋮ | ⋮ | ⋮ |
| >tn | Pn | Span/Pn | Divn |

SPECTRUM ANALYZER

This is a continuation-in-part of U.S. application Ser. No. 08/704,622 filed Dec. 23, 1996 which is a 371 of PCT/JP96/00115 filed Jan. 23, 1996.

FIELD OF THE INVENTION

This invention relates to a wide band receiver such as a spectrum analyzer, and more particularly, to a local oscillator to be used in a frequency spectrum analyzer which is able to reduce dynamic spurious responses caused by a digital step sweep operation of the local oscillator.

BACKGROUND OF THE INVENTION

A wide band receiver such as a frequency spectrum analyzer is used to analyze frequency components of an incoming signal. An example of conventional spectrum analyzer utilizes a local oscillator whose frequency is digitally controlled by a step sweep signal through a direct digital synthesizer (DDS) technology. Such a conventional example of spectrum analyzer is explained with reference to FIGS. 4, 5 and 6.

In the example of FIG. 4, the frequency spectrum analyzer is formed of a frequency converter 50, a detector 62, a display arithmetic unit 64, and a display 68. As also shown in FIG. 4, the frequency converter 50 includes an attenuator 51, a first frequency mixer 52, a local oscillator 30, a second frequency mixer 53, a fixed local oscillator 54 and a band pass filter (BPF) 55.

The frequency converter 50 receives an input signal 100 to be analyzed and converts the input signal to an intermediate frequency signal when the local oscillator sweeps its frequency for a specified frequency range. In this example, the intermediate frequency signal is created by mixing the input signal 100 with a first local signal from the local oscillator 30 and a second local signal from the fixed local oscillator 54. The intermediate frequency signal is filtered by the BPF 55 to a predetermined band width and is then provided to the detector 62.

The BPF 55 may be formed of a plurality of band pass filters having a variety of resolution bandwidth which are set by a user. When two or more frequency spectrum in the input signal have small frequency differences, a band pass filter of sufficiently small bandwidth must be used to fully distinguish the frequency spectrum from the others.

The detector 62 detects DC voltages, i.e., envelope voltages, of the intermediate frequency signals from the BPF 55. The detected voltages are provided to the display 68 through the display arithmetic unit 64. The frequency spectrum contained in the input signal are displayed on the display 68 in a frequency domain wherein the horizontal axis is a frequency having a variable frequency span (frequency range on a full display) and the vertical axis is a power level.

The local oscillator 30 is a sweep oscillator which can sweep a desired frequency range in a step manner with use of the DDS (direct digital synthesizer) technology. As shown in FIG. 5, the local oscillator 30 includes a DDS time base 32, a DDS 40, a D/A (digital to analog) converter 34, a LPF (low pass filter) 35, a phase comparator 36, a divider 37, an integrator 38, and a YTO (YIG-tuned oscillator) 39. A phase lock loop (PLL) is formed of the YTO 39, the divider 37, the phase comparator 36, and the integrator 38.

The DDS time base 32 receives a reference clock 31 and sweep conditions 33 which includes a span (sweep frequency range) and a sweep time $T_{swp}$ and delivers a clock signal $32_{ck}$ to the DDS 40. The clock signal $32_{ck}$ has a unit step time $T_{step}$ which is produced by dividing the reference clock 32 by a division factor Div, i.e., $T_{step}$=(reference clock 31)/Div. Thus, one clock time period of the clock signal $32_{ck}$ is equal to the unit step time $T_{step}$ in the step sweep of the local oscillator 30.

The DDS 40 is a synthesizer which generates digital data representing a digital sine wave of a desired frequency. As shown in FIG. 6, the DDS 40 is formed of a frequency register 42, an adder 44, and a ROM table memory 46.

The frequency register 42 stores advance phase data $42_{dt}$ and provides the phase data $42_{dt}$ to one input of the adder 44. The advance phase data is 32 bit data, for example, and defines a magnitude of phase advance of a sine wave to be generated by the local oscillator 30. By this data, as shown in a stepped ramp signal of FIG. 7A, a unit step frequency 92 is accumulated at every unit step time $T_{step}$, which results in one sweep time $T_{swp}$=M×$T_{step}$. Here, M is a constant number of steps, such as 2,048 steps, in an overall sweep.

The adder 44 is for example a 32 bit accumulator to advance the unit phase of the above noted unit frequency 92 of the sine wave. At every clock signal $32_{ck}$ from the DDS time base 32, one input terminal of the adder 44 receives the advance phase data $42_{dt}$ from the register 42, while the other input terminal receives the data from a register $44_r$ connected to the output of the adder 44. The register $44_r$ holds the output data of the adder 44 produced in the previous accumulation cycle. Thus, the adder 44 accumulates the data at the two input terminals and the result is latched in the register $44_r$ for the next cycle.

The ROM table memory 46 converts the received data to step like sine wave data. For example, the ROM table memory 46 uses data in the upper 10 bit of 32 bit data from the adder 44 as address data to read 10 bit sine wave data $46_{dt}$ from the table memory 46. The sine wave data $46_{dt}$ is supplied to the D/A converter 34 shown in FIG. 5.

The D/A converter 34 in FIG. 5 converts the 10 bit sine wave data $46_{dt}$ to a step like analog signal. The LPF 35 removes frequency components of the clock signal $32_{ck}$ in the step like analog signal to make a sine wave analog signal and provides the sine wave analog signal to one input terminal of the phase comparator 36.

The phase comparator 36 detects phase differences between the two input signals and generates voltage signals representing the phase differences. Namely, the phase comparator 36 receives a reference phase signal from the DDS through the LPF 35 as well as an oscillation signal $39_{osc}$ of the YTO 39 whose frequency is divided by 1/N at the divider 37. The YTO 39 is a voltage controlled oscillator. The phase comparator 36 compares the phases of the two input signals and generates a voltage signal representing the phase differences between the two input signals. The voltage signal is applied to the integrator 38 which is typically a low pass filter. The integrator 38 integrates the voltage signals to produce an analog DC voltage which is supplied to an voltage control input of the YTO 39.

The YTO 39 is a variable resonance oscillator in a microwave frequency band using, for example, a YIG (Yttrium Iron Garnet) crystal. The YTO 39 receives the analog DC voltage from the integrator 38 and generates the step sweep frequency signal $39_{osc}$ which is phase locked by the PLL loop noted above. The sweep signal $39_{osc}$ is supplied to the frequency mixer 52 in the frequency converter 50 to convert the frequency of the input signal 100 to the intermediate frequency signal through the first and second frequency mixers 52 and 53.

As in the foregoing, the sweep operation of the local oscillator 30 is performed in the step manner. Therefore, as shown in FIG. 7A, the frequency of the local signal is also swept in the step like manner, and thus, the swept frequency varies discontinuously. As a result, a dynamic spurious response which is inverse proportional to the unit step time $T_{step}$, i.e., $\Delta f=1/T_{step}$ is induced as shown in FIG. 7B. Because the spurious frequency $\Delta f$ is close to a center frequency $f_o$ of the input signal under measurement, it is difficult to remove this dynamic spurious by a filter circuit. Thus, the spurious will be displayed at the frequency positions $f_o \pm \Delta f$ on the display of the frequency spectrum analyzer even though the input signal does not have the frequency spectrum $\Delta f$.

SUMMARY OF THE INVENTION

Therefore, it is an object of the present invention to provide a frequency spectrum analyzer having a step sweep local oscillator which is capable of minimizing a dynamic spurious response which is inverse proportional to a unit step time of the step sweep.

It is another object of the present invention to provide a step sweep local oscillator to be used in a frequency spectrum analyzer for minimizing a spurious response by incorporating a random clock to each of the unit step times in sweeping the local oscillator.

It is a further object of the present invention to provide a step sweep local oscillator to be used in a frequency spectrum analyzer for minimizing a spurious response by increasing the number of steps in sweeping the local oscillator when the sweep speed is decreased.

In the first aspect of the present invention, it is included in the spectrum analyzer a random clock delay which provides a random clock to a direct digital synthesizer (DDS). The random clock is a clock where a time length of a unit step time for step sweeping the local oscillator is modified to be random.

The random clock delay, by making the timing edges of the unit step time random, diffuses the dynamic spurious frequency $\Delta f=1/T_{step}$ generated by the local oscillator where $T_{step}$ represents the unit step time. Accordingly, the spectrum analyzer of this invention is considerably less affected by the dynamic spurious of the local oscillator which is swept by a digital step sweep through the DDS.

In another aspect of the present invention, a sweep step number control is provided to increase the number of steps M within a sweep time of the local oscillator. Here, the sweep time $T_{swp}=$(number of steps M)×(unit step time $T_{step}$). The sweep step number control determines a division factor for dividing the reference clock signal so as to increase the step number M when the sweep time is relatively long and provides the division factor to a DDS time base wherein the reference clock is divided based on the division factor. The sweep step number control 22 also provides advance phase data to the DDS corresponding to the increased step number M.

By increasing the step number M with the use of the sweep step number control, and thus sweeping the local oscillator with smaller steps, the dynamic spurious will be reduced by a square of the step number M.

The dynamic spurious will be further reduced by combining the first and second aspects of the present invention noted above.

The random clock delay in the first aspect of the invention generates the random step time which is, in average, almost the same as the unit step time. Consequently, the step sweep for the local oscillator operates randomly and thus the frequency spectrum of a dynamic spurious frequency component $\Delta f=1/T_{step}$ is spread in a frequency domain. Therefore, the noise level caused by the dynamic spurious is significantly reduced.

The sweep step control in the second aspect of the invention increases the step number M to satisfy the relationship $T_{swp}=M\times T_{step}$ where $T_{swp}$ is a sweep time and provides the division factor corresponding to the increased step number M to the time base. The sweep step control also provides the advanced phase data to the DDS. Thus, the local oscillator is swept with smaller steps. By increasing the step number M, the dynamic spurious is reduced by the square of the step number M.

As in the foregoing, according to the present invention, the improvement in the local oscillator is achieved in which the dynamic spurious accompanied by the digital step sweep is considerably reduced.

DETAILED DESCRIPTION OF THE EMBODIMENTS

The first embodiment of the present invention will be explained with reference to FIGS. 1 and 2. In this embodiment, the dynamic spurious response caused by a step sweep in a spectrum analyzer is reduced by modifying the unit step time $T_{step}$ for sweeping the local oscillator to be random time length. Thus, the spurious responses spread randomly in a relatively wide bandwidth of the spectrum analyzer, resulting in reduced peak responses which may no longer be visible on the display.

In the conventional technology, because the local oscillator is swept by using a plurality of fixed unit step time $T_{step}$, a dynamic spurious frequency $\Delta f$ will be produced at a fixed interval of frequency as a relatively large noise level. The spurious frequency is inverse proportional to a time length of the unit step time, i.e., $\Delta f=1/T_{step}$, For example, when a sweep time is 200 millisecond and the number of steps in one sweep is 2,000, the unit step time is 0.1 millisecond. In this situation, the spurious frequency is a fixed frequency of 10 KHz which is too low to filter out. In the present invention, the energy of this spurious responses are spread across a relatively wide rage of frequency band of the spectrum analyzer.

Figure 1:
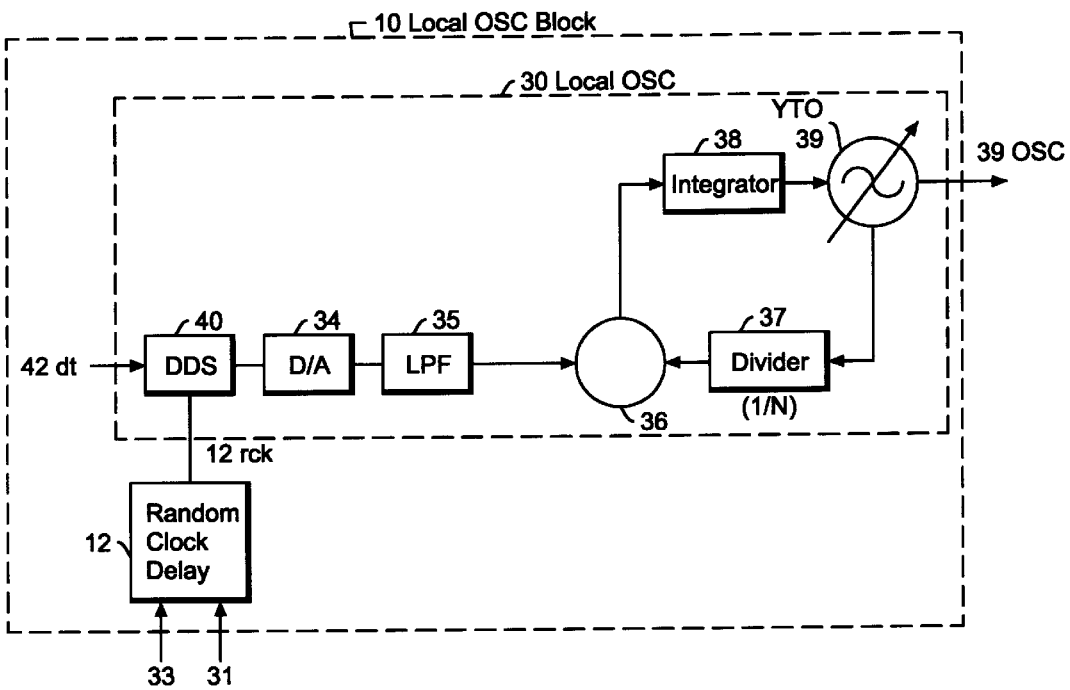
FIG. 1 is a block diagram showing a structure of local oscillator wherein a time length of a unit step time $T_{step}$ is controlled to be random according to the first embodiment of the present invention.
Figure 2:
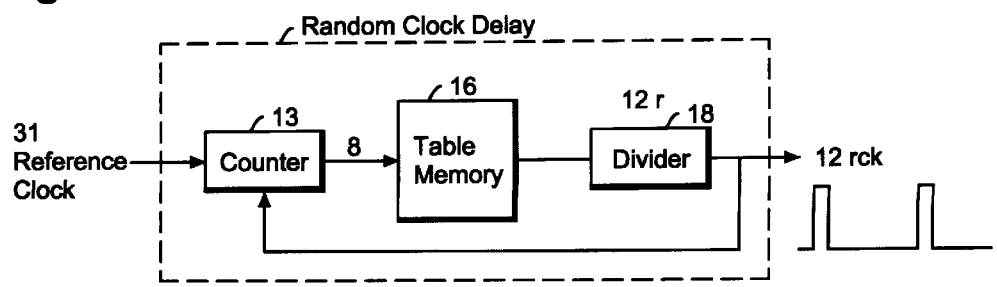
FIG. 2 is a block diagram showing a structure of a random clock delay 12 in the first embodiment of the present invention.
Figure 5:
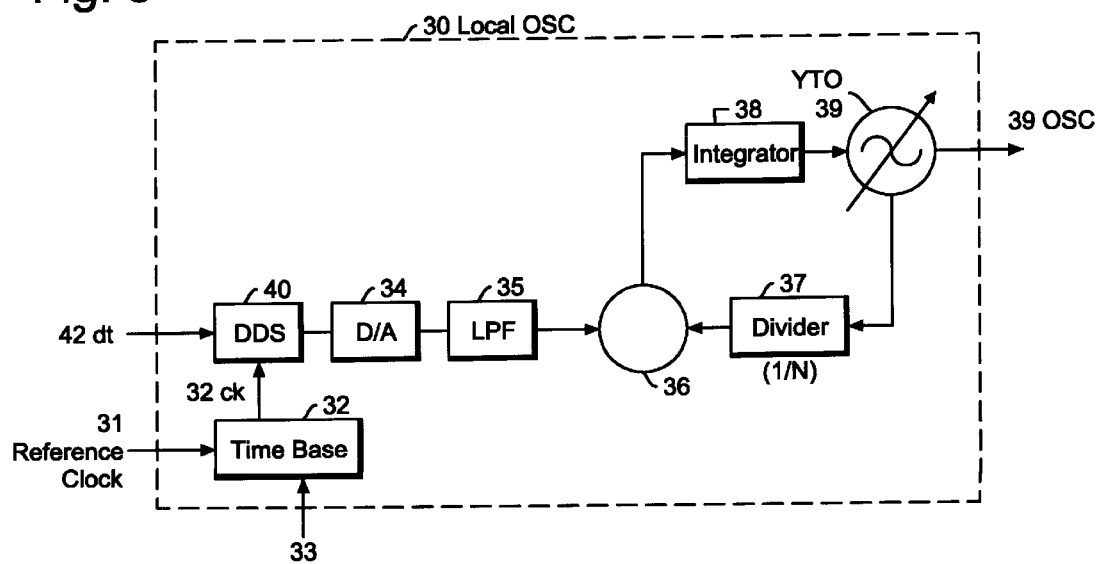
FIG. 5 shows a structure of a conventional local oscillator.
Figure 6:
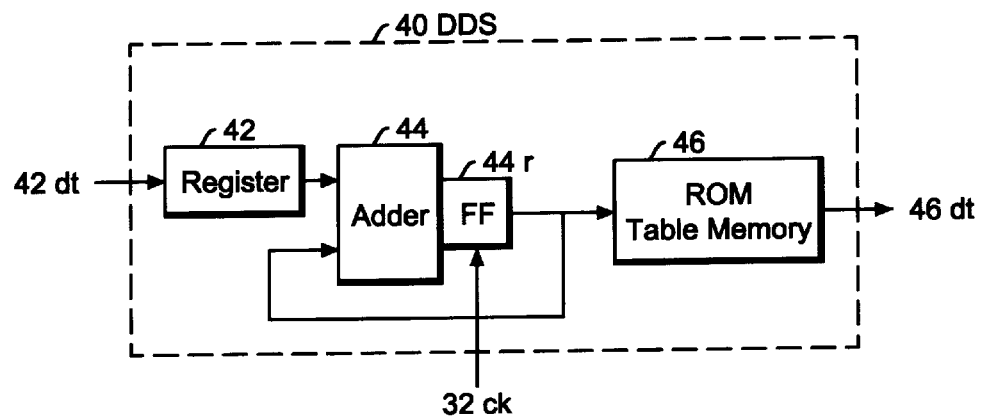
FIG. 6 shows a structure of a direct digital synthesizer (DDS) 40.
Figure 7A:
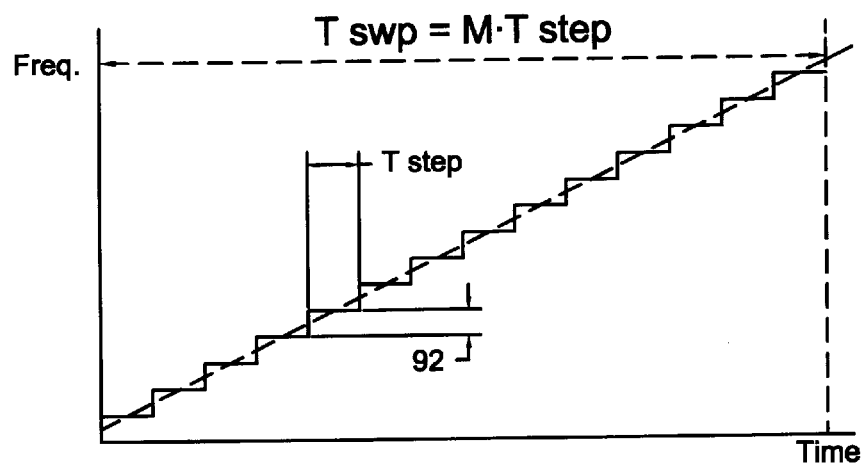
FIG. 7A is a schematic diagram showing a sweep waveform wherein the frequency of the local oscillator changes in a step manner.
Figure 7B:
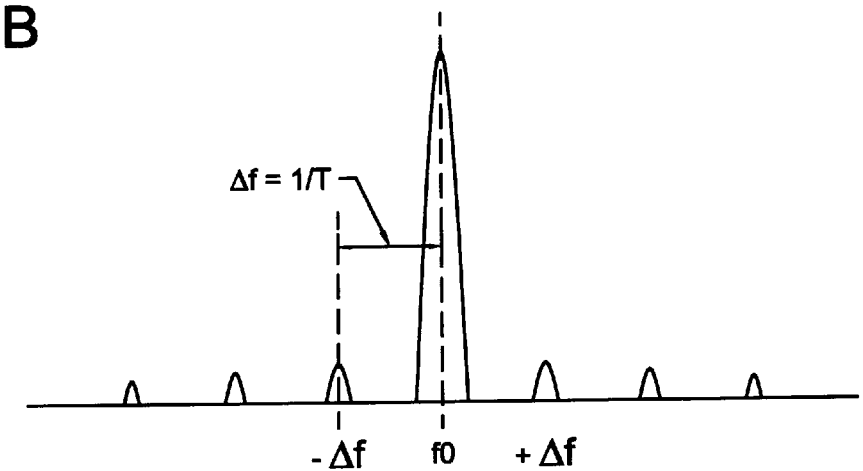
FIG. 7B is a schematic diagram showing dynamic spurious responses accompanied by the spectrum analyzer using the conventional local oscillator.

As shown in FIG. 1, a local oscillator 10 of the present invention includes a random clock delay 12 instead of the DDS time base 32 in the conventional local oscillator of FIG. 5. Remaining structure of the local oscillator 30 is the same as the conventional technology of FIG. 5.

The random clock delay 12 receives a reference clock 31 and sweep condition information 33 and generates a random clock $12_{rck}$ having random edges but, in average, the same length of the unit step time $T_{step}$. The random clock $12_{rck}$ is provided to the direct digital synthesizer (DDS) 40. To do this, as shown in FIG. 2, the random clock delay 12 is formed of an address counter 13, a table memory 16 and a divider 18.

The address counter 13 is, for example, an 8-bit counter which increments by one in synchronism with a reference clock 31 every time it receives the random clock $12_{rck}$ feedbacked from the output of the random clock delay 12. The output of the address counter 13 is provided to the table memory 16 as the address signal.

The table memory 16 is a memory which stores pseudo-random data. The data stored in the table memory 16 is set in such a way that a random signal be generated by accessing the data therefrom while an average of the data in all of the addresses is equal to the specified unit step time $T_{step}$. By receiving the 8 bit address signal from the address counter 13, the table memory 16 generates random data $12_{rd}$ which is provided to the divider 18.

The divider 18 receives the random data $12_{rd}$ and divides the random data by a specified division ratio to produce a random clock signal $12_{rck}$ which has the unit step time $T_{step}=12_{rd}/$(reference clock 31). The random clock signal $12_{rck}$ is provided to the DDS 40 as a time base. The random clock signal $12_{rck}$ is also provided to the address counter 13 as a count enable signal.

By repeating the above procedure, the step sweep for the local oscillator is modified to include the random timing edges. As a result, the dynamic spurious frequency $\Delta f=1/T_{step}$ is spread in a wide frequency range while reducing an energy level, which achieves a local oscillator of reduced dynamic spurious.

The second embodiment of the present invention is explained with reference to FIGS. 3A and 3B. In this embodiment of the present invention, by controlling the direct digital synthesizer (DDS) when sweeping the local oscillator in a manner to increase the number of steps in the step sweep of the local oscillator, dynamic spurious components can be easily removed. In this situation, the step number M is increased and thus the unit step time becomes correspondingly short so that the local oscillator is swept with smaller steps. Consequently, the spurious frequency $\Delta f=1/T_{step}$ becomes relatively high and apart from a signal to be analyzed, resulting in easy removal by, for example, the band pass filter in the spectrum analyzer.

In the prior art technology, the step number M in the step sweep is a fixed number, such as 2,048, which forms one cycle of the step sweep. In other words, the fixed step number M is used all the time whether the sweep speed is high or low. When the sweep speed is high (sweep time is short), since the dynamic spurious $\Delta f$ is sufficiently apart from the center frequency $f_o$ of an input signal to be tested, the spurious will not appear as a noise level on the display of the spectrum analyzer.

However, when the sweep speed is low (sweep time is long), since the dynamic spurious $\Delta f$ is close to the center frequency $f_o$ of the measuring signal, it is difficult to remove the spurious frequency. This is because it requires a very sharp, narrow band and highly stable filter to remove the spurious frequency without affecting the frequency spectrum of the signal under test. Therefore, in the present invention, in controlling an operation of the direct digital synthesizer (DDS) of the local oscillator, the step number M is regulated to be maximum as long as the specified sweep time satisfies the relationship $T_{swp}=M\times T_{step}$ to reduce the dynamic spurious.

The effect of the invention is mathematically expressed as follows. Where a frequency range of a sweep is Span and the number of measurement points in the sweep is P (same as the number of steps M), a step frequency $\Delta f_{step}$ (frequency change per step) is equal to Span/P. A step frequency time $\Delta f_m$ is equal to $P/T_{swp}$ where $T_{swp}$ is a sweep time. The dynamic spurious level S under this relationship is expressed as:

$$S\ [dB]=20\ \log(\Delta f_{step}/2\times\Delta f_m)$$
$$=20\ \log\ (Span\times T_{swp}/2\times P^2)$$

By this expression, it is known that the dynamic spurious will be reduced by the square of the measurement points P (the step number M). For example, when the step number M is doubled, the dynamic spurious will be improved four times, i.e., 12 dB.

Figures 3A, 3B:
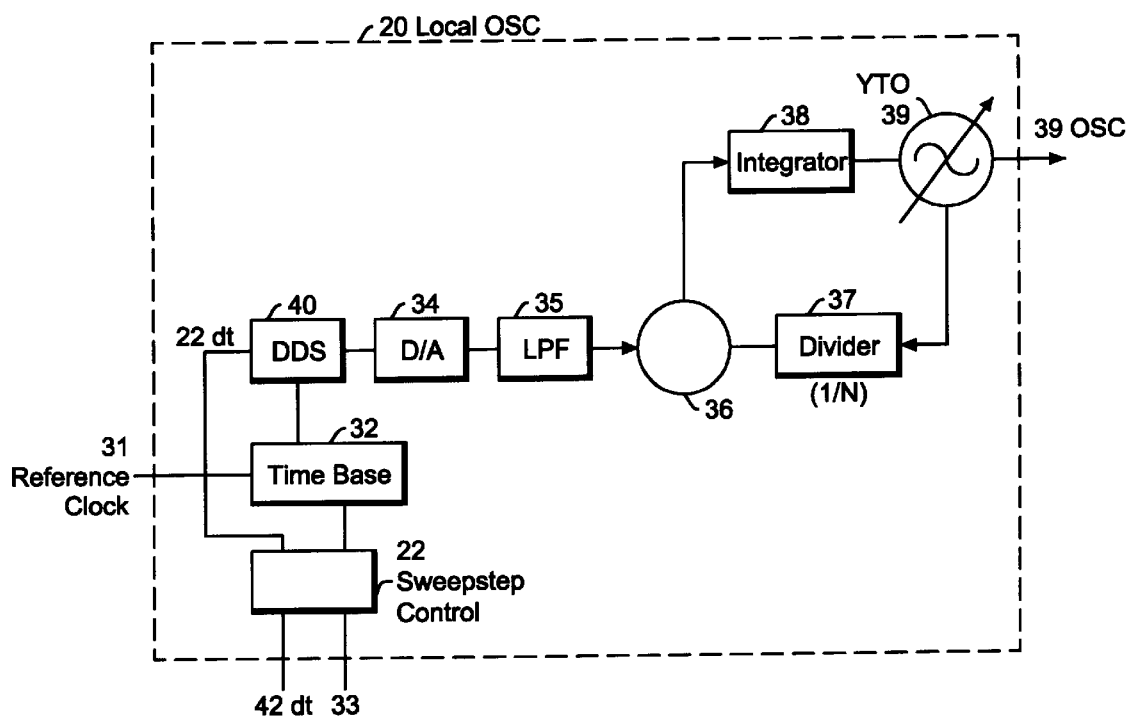
FIG. 3A is a block diagram showing a structure of local oscillator wherein the number of steps is increased so as to sweep the local oscillator with smaller steps according to the second embodiment of the present invention.
FIG. 3B is a schematic diagram showing a data table in the sweep step control in the second embodiment of the present invention.
Figure 4:
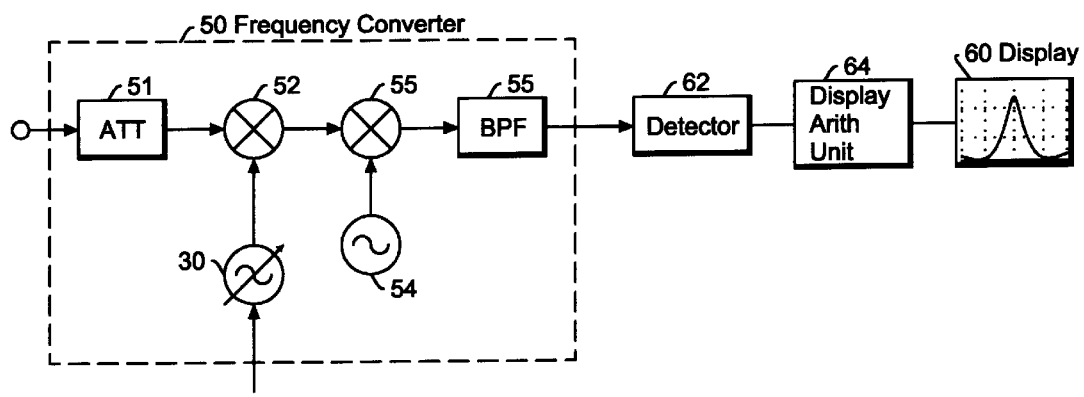
FIG. 4 is a block diagram showing a structure of spectrum analyzer using a conventional local oscillator which is step swept based on a digital signal.

To do this, the local oscillator 20 in FIG. 3A includes a sweep step number control 22. Remaining components in the local oscillator 20 are the same as in the conventional local oscillator.

The sweep step number control 22, based on the advance phase data $42_d$ and the sweep condition 33, determines the maximum available step number M which satisfies $T_{swp}=M\times T_{step}$ but within the operable range of the local oscillator. The sweep step number control 22 provides the division factor Div which satisfies this relationship to the time base 32. The sweep step number control 22 also determines and provides the advance phase data $22_d$ (frequency for each step) to the DDS 40. As an example, when M=2,048 and Div=100 in the conventional arrangement, by making Div=25 and M=8,192 in the present invention, the step number is increased four times. As a result, the dynamic spurious will be reduced by 24 dB according to the above equation.

For example, the sweep step number control 22 is formed of a micro controller such as a digital signal processor (DSP) and includes a data table such as shown in FIG. 3B. Sweep frequency data $42_d$ including Span data (frequency range of one whole sweep) and sweep condition 33 including sweep time data. Based on the sweep frequency Span and the sweep time t, the sweep step number control 22 selects the highest possible measurement points P (step number M) in the table. The sweep control 22 further determines advance phase data $22_d$ (step frequency) based on Span/P and division factor Div in the table. The advance phase data $22_d$ is sent to the DDS 40 to define the frequency change in each step while the division factor Div is sent to the time base 32 to define the reference clock rate to the DDS 40.

In the foregoing first embodiment, the random clock delay 12 is formed of the address counter 13, the table memory 16 and the divider 18. Other circuit arrangement is also possible such as using a PRBS (pseudo random binary sequence) generator which generates a maximum length sequence random signal.

According to the present invention configured as in the foregoing has the following effects:

The random clock delay 12 in the first embodiment generates the random step time which has, in average, the same time length as the unit step time $T_{step}$. Consequently, the step sweep for the local oscillator operates randomly and thus the dynamic spurious frequency component $\Delta f=1/T_{step}$ is spread to a wider frequency range with smaller peak energy. Therefore, the noise level caused by the dynamic spurious is significantly reduced.

The sweep step number control 22 in the second embodiment increases the step number M (measurement points P) to satisfy the relationship $T_{swp}=M \times T_{step}$ and provides the division factor Div corresponding to the step number M to the time base 32. The sweep step control 22 also provides the advance phase data $22_d$ to the DDS 40. Thus, the local oscillator is swept with smaller frequency steps. Thus, by increasing the step number M, the dynamic spurious is reduced by the square of the step number M.

As in the foregoing, according to the present invention, the improved local oscillator is achieved in which the dynamic spurious responses accompanied by the digital step sweep is considerably reduced.

What is claimed is:

1. A spectrum analyzer, comprising:
   a frequency converter for converting a frequency of an input signal to be measured to an intermediate frequency;
   a local oscillator having a direct digital synthesizer for generating a local signal whose frequency is swept within a predetermined frequency range in manner of a step sweep formed of a large number of unit step time driven by a clock signal, said local oscillator having a random clock delay circuit to modify said clock signal to incorporate pseudo random properties;
   a band pass filter connected to said frequency converter and having a specified bandwidth for allowing an intermediate signal from said frequency converter having said intermediate frequency to pass therethrough;
   a detector for receiving said intermediate signal from said band pass filter and detecting an amplitude thereof; and
   a display for displaying a detected signal from said detector in a frequency domain as frequency spectrum of said input signal.

2. A spectrum analyzer as defined in claim 1, wherein said random clock delay circuit receives said clock signal and produces a random clock signal which is supplied to said direct digital synthesizer.

3. A spectrum analyzer as defined in claim 1, wherein said local oscillator further includes a D/A (digital to analog) converter to convert a digital signal from said direct digital synthesizer to an analog signal, and a voltage controlled oscillator which generates said local signal whose frequency is controlled by said analog signal from said D/A converter.

4. A spectrum analyzer as defined in claim 3, wherein said voltage controlled oscillator is provided in a phase lock loop and said analog signal is provided to said phase lock loop as a reference frequency.

5. A spectrum analyzer as defined in claim 1, wherein said random clock delay circuit is formed of a counter which counts said clock signal to produce an address signal, a memory having a random data therein and addressed by said address signal from said counter, and a divider for dividing said random data from said memory.

6. A spectrum analyzer as defined in claim 1, wherein said random clock delay circuit generates a random clock to produce a random step time whose average is the same as said unit step time and provides said random clock to said direct digital synthesizer.

7. A spectrum analyzer, comprising:
   a frequency converter for converting a frequency of an input signal to be measured to an intermediate frequency;
   a local oscillator having a direct digital synthesizer for generating a local signal whose frequency is swept within a predetermined frequency range in manner of a step sweep formed of a large number of frequency steps driven by a clock signal, said local oscillator having a sweep step number control to increase the number of steps in said step sweep when a sweep time of said step sweep is large;
   a band pass filter connected to said frequency converter and having a specified bandwidth for allowing an intermediate signal from said frequency converter having said intermediate frequency to pass therethrough;
   a detector for receiving said intermediate signal from said band pass filter and detecting an amplitude thereof; and
   a display for displaying a detected signal from said detector in a frequency domain as frequency spectrum of said input signal.

8. A spectrum analyzer as defined in claim 7, wherein said local oscillator further includes a time base circuit for producing said clock signal to said direct digital synthesizer by dividing a reference clock signal by a division factor provided from said sweep step control.

9. A spectrum analyzer as defined in claim 8, wherein said sweep step control includes a data table for producing therefrom said division factor to be supplied to said time base circuit and a frequency step data to be supplied to said direct digital synthesizer on the basis of said sweep time to maximize said number of steps in said step sweep.

10. A spectrum analyzer as defined in claim 7, wherein said local oscillator further includes a D/A (digital to analog) converter to convert a digital signal from said direct digital synthesizer to an analog signal and a voltage controlled oscillator which generates said local signal whose frequency is controlled by said analog signal from said D/A converter.

11. A spectrum analyzer as defined in claim 7, wherein said voltage controlled oscillator is provided in a phase lock loop and said analog signal is provided to said phase lock loop as a reference frequency.

\* \* \* \* \*